(12) United States Patent
Konishi et al.

(10) Patent No.: US 9,425,248 B2
(45) Date of Patent: Aug. 23, 2016

(54) COMPOSITE SUBSTRATE

(71) Applicant: SHIN-ETSU CHEMICAL CO., LTD., Tokyo (JP)

(72) Inventors: Shigeru Konishi, Annaka (JP); Yoshihiro Kubota, Annaka (JP); Makoto Kawai, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/358,923

(22) PCT Filed: Dec. 20, 2012

(86) PCT No.: PCT/JP2012/082999
§ 371 (c)(1),
(2) Date: May 16, 2014

(87) PCT Pub. No.: WO2013/094665
PCT Pub. Date: Jun. 27, 2013

(65) Prior Publication Data
US 2014/0327116 A1   Nov. 6, 2014

(30) Foreign Application Priority Data
Dec. 22, 2011   (JP) .................. 2011-280806

(51) Int. Cl.
*H01L 29/02*   (2006.01)
*H01L 21/20*   (2006.01)
*H01L 21/02*   (2006.01)

(52) U.S. Cl.
CPC .......... *H01L 29/02* (2013.01); *H01L 21/02002* (2013.01); *H01L 21/2007* (2013.01)

(58) Field of Classification Search
CPC ................ H01L 23/5329; H01L 29/02; H01L 21/02002; H01L 21/2007

USPC .......................................................... 257/632
See application file for complete search history.

(56) References Cited

U.S. PATENT DOCUMENTS 5,672,848 A   9/1997   Komorita et al.
5,855,693 A   1/1999   Murari et al.
(Continued)

FOREIGN PATENT DOCUMENTS

EP   0 459 283 A1   12/1991
EP   1 901 345 A1   3/2008
(Continued)

OTHER PUBLICATIONS

International Search Report, dated Jan. 22, 2013, issued in corresponding application No. PCT/JP2012/082999.
(Continued)

*Primary Examiner* — Fernando L Toledo
*Assistant Examiner* — Neil Prasad
(74) *Attorney, Agent, or Firm* — Westerman, Hattori, Daniels & Adrian, LLP

(57) ABSTRACT

Disclosed is a composite substrate, which is provided with an inorganic insulating sintered substrate, which has a heat conductivity of 5 W/m·K or more, and a volume resistivity of $1\times10^8$ Ω·cm or more, and a single crystal semiconductor film, or a composite substrate, which is provided with the inorganic insulating sintered substrate, a single crystal semiconductor film, and a thin layer configured of at least one kind of material selected from among an oxide, a nitride, and an oxynitride, said thin layer being provided between the inorganic insulating sintered substrate and the single crystal semiconductor film. According to the present invention, a low-cost composite substrate with suppressed metal impurity contamination can be provided using an inorganic insulating sintered body, which is opaque to visible light, and which has excellent heat conductivity, and furthermore, a small loss in a high frequency region.

10 Claims, 1 Drawing Sheet

(56) References Cited

U.S. PATENT DOCUMENTS

| | | |
|---|---|---|
| 6,391,812 B1 | 5/2002 | Araki et al. |
| 9,184,228 B2 * | 11/2015 | Seki ............... H01L 29/02 |
| 2007/0138601 A1 * | 6/2007 | Fan et al. ............... 257/632 |
| 2007/0190756 A1 | 8/2007 | Uchida |
| 2008/0296584 A1 | 12/2008 | Hachigo |
| 2009/0080136 A1 * | 3/2009 | Nagayama et al. ......... 361/234 |
| 2010/0193900 A1 | 8/2010 | Ohmi et al. |

FOREIGN PATENT DOCUMENTS

| | | |
|---|---|---|
| JP | 60-254722 A | 12/1985 |
| JP | 04-082256 A | 3/1991 |
| JP | 3083725 B2 | 9/2000 |
| JP | 2001-064080 A | 3/2001 |
| JP | 2005-223304 A | 8/2005 |
| JP | 2010-278160 A | 12/2010 |
| JP | 2011-181907 A | 9/2011 |
| WO | 2009/011152 A1 | 1/2009 |

OTHER PUBLICATIONS

Written Opinon, dated Jan. 22, 2013, issued in corresponding application No. PCT/JP2012/082999.

Japanese Office Action dated Feb. 10, 2015, issued in corresponding JP Patent Application No. 2013-550319 (5 pages).

Singaporean Search Report and Written Opinion dated Apr. 2, 2015, issued in corresponding SG Patent Application No. 11201403501P (8 pages).

Extended European Search report dated Jul. 3, 2015, Issued in counterpart European application No. 12859808.3. (8 pages).

Chichignoud G et al., "High temperature processing of poly-SiC substrates from the vapor phase for wafer-bonding", Surface and Coatings Technology, Elsevier, Amsterdam, NL, Dec. 20, 2006 vol. 201, No. 7, (pp. 4014-4020). Cited in Extended European Search Report dated Jul. 3, 2015.

* cited by examiner

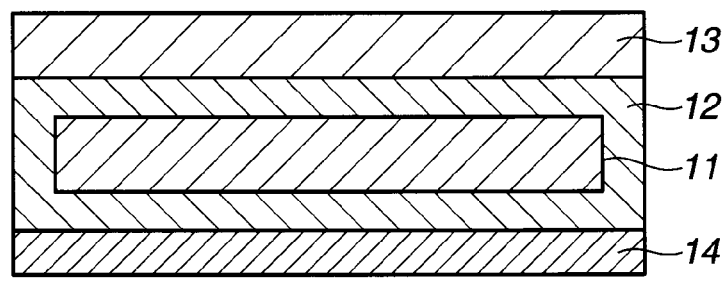

COMPOSITE SUBSTRATE

TECHNICAL FIELD

This invention relates to a composite substrate suited for semiconductor device fabrication, comprising an inorganic insulating sintered body having a high heat conductivity, typically silicon nitride, and a single crystal semiconductor film, typically silicon thin film, formed on its surface.

BACKGROUND ART

Recently, silicon base semiconductor devices are increasingly improved in performance as their design rule is miniaturized. It is then critical how to dissipate heat from discrete transistors and metal interconnects between transistors. To address the problem, several measures are taken wherein after device fabrication, the silicon substrate on the back surface is thinned to one to several hundreds of microns, and a large fan is mounted on the chip to promote heat dissipation, or a water-cooled tube is arranged therearound.

However, even when the silicon substrate is actually thinned, the region where the device is fabricated extends several microns from the surface, and the remaining region serves as a heat sump and remains less efficient from the aspect of heat dissipation. Also, SOI wafers used in high-performance processors or the like have the structure including an insulating layer of $SiO_2$ interposed immediately below a device active layer, which structure raises a serious problem from the aspect of heat dissipation because $SiO_2$ has a low heat conductivity of 1.38 W/m·K. Further, silicon substrates suffer a substantial loss in the high-frequency region due to their dielectric properties, with their use being limited.

The silicon-on-sapphire (SOS) technology using sapphire substrate is considered attractive because of efficient heat conduction and low losses in the high-frequency region, but suffers from the following problems. One problem is that since the sapphire substrate is transparent in the visible light region, it is not detected by the optical sensor used for the confirmation of a substrate or for the alignment of a wafer during the device fabrication process. Another problem is that sapphire substrates are expensive.

Exemplary of the substrate which is opaque to visible light, heat conductive and inexpensive are sintered ceramic bodies such as silicon nitride and aluminum nitride. Since these materials are obtained by sintering silicon nitride or aluminum nitride powder together with sintering aids, metal impurities like Fe and Al in the powder or sintering aids like alumina themselves become a cause of contamination to the device fabrication process. These materials are thus awkward to use.

It is noted that Patent Document 1 (JP-A H04-82256) discloses a substrate having a $SiO_2$ film deposited thereon by CVD method for the purposes of insulation and anti-contamination. No reference is made to volume resistivity.

CITATION LIST

Patent Document

Patent Document 1: JP-A H04-82256

SUMMARY OF INVENTION

Technical Problem

An object of the invention, which has been made under the above-mentioned circumstances, is to provide a composite substrate comprising an inorganic insulating sintered body substrate which is opaque to visible light, has high heat conductivity and a low loss in the high-frequency region, and is cheap, and a single crystal semiconductor thin film deposited thereon, the composite substrate being suppressed in contamination with metal impurities from the sintered body.

Solution to Problem

The inventors have found that the above object is effectively attained by providing a composite substrate comprising an inorganic insulating sintered body substrate having a heat conductivity of at least 5 W/m·K and a volume resistivity of at least $1\times10^8$ Ω·cm, a single crystal semiconductor film, and optionally, a thin layer of oxide, nitride or oxynitride disposed between the inorganic insulating sintered body substrate and the single crystal semiconductor film.

Specifically, the invention provides a composite substrate as defined below.

[1] A composite substrate comprising an inorganic insulating sintered body substrate having a heat conductivity of at least 5 W/m·K and a volume resistivity of at least $1\times10^8$ Ω·cm, a single crystal semiconductor film, and optionally, a thin layer disposed between the inorganic insulating sintered body substrate and the single crystal semiconductor film, said thin layer being composed of at least one component selected from among an oxide, nitride, and oxynitride.

[2] The composite substrate of [1] wherein said thin layer is formed to cover the inorganic insulating sintered body substrate in entirety.

[3] The composite substrate of [1] or [2] wherein the inorganic insulating sintered body is silicon nitride, aluminum nitride or SiAlON.

[4] The composite substrate of any one of [1] to [3] wherein the single crystal semiconductor is single crystal silicon.

[5] The composite substrate of any one of [1] to [4] wherein said thin layer is a film of high purity $SiO_2$, $Si_3N_4$, or $SiO_xN_y$ wherein $0<x<2$ and $0<y<1.3$, deposited by an electron beam evaporation or chemical vapor deposition method.

[6] The composite substrate of any one of [1] to [4] wherein said thin layer is of silicon nitride deposited by a chemical vapor deposition method.

[7] The composite substrate of any one of [1] to [6], further comprising a layer of polycrystalline or amorphous silicon on at least the back surface of the composite substrate.

Advantageous Effects of Invention

According to the invention, a cheap composite substrate which is suppressed in contamination with metal impurities is provided at a low cost by using an inorganic insulating sintered body which is opaque to visible light, has high heat conductivity and a low loss in the high-frequency region, and is cheap.

BRIEF DESCRIPTION OF DRAWING

FIG. 1 is a diagram showing the construction of a composite substrate according to one embodiment of the invention.

DESCRIPTION OF EMBODIMENTS

The substrate used in the practice of the invention is an inorganic insulating sintered body having a heat conductivity which is preferably higher than the heat conductivity (1.5

W/m·K) of $SiO_2$, more preferably at least 5 W/m·K, and even more preferably at least 10 W/m·K. The heat conductivity is typically up to 2,500 W/m·K, especially up to 2,000 W/m·K although its upper limit is not critical.

To suppress a power loss due to dielectric properties, the substrate should desirably have a volume resistivity as high as possible, preferably at least $1 \times 10^8$ Ω·cm, and more preferably at least $1 \times 10^{10}$ Ω·cm. The volume resistivity is typically up to $1 \times 10^{18}$ Ω·cm, especially up to $1 \times 10^{16}$ Ω·cm although its upper limit is not critical. Exemplary of the inorganic insulating sintered body meeting these requirements are sintered bodies of silicon nitride, aluminum nitride, SiAlON ($Si_3N_4 \cdot Al_2O_3$) and the like.

Among these, silicon nitride is most preferred because of high resistance to chemical liquids used in the device fabrication process and a low cost of substrate formation.

It is noted that the substrate preferably has a thickness of 100 to 2,000 μm, more preferably 200 to 1,000 μm.

Sometimes the sintered body contains metal elements such as Fe and Al, typically much Al, with a likelihood that such metal elements may exert detrimental effects when leached out or diffused during the device fabrication process.

In this regard, provided that the impurity concentration in a substrate is analyzed by the ICP-MS method, if the Fe concentration is up to $1 \times 10^{17}$ atoms/$cm^3$ and the Al concentration is up to $1 \times 10^{17}$ atoms/$cm^3$, then a single crystal semiconductor film can be formed directly on the substrate surface. If the Fe concentration is from more than the indicated value to $1 \times 10^{20}$ atoms/$cm^3$ and the Al concentration is from more than the indicated value to $1 \times 10^{20}$ atoms/$cm^3$, then the substrate in its entirety is preferably covered with a thin film of oxide, nitride or oxynitride in order to prevent these impurities from leaching out. Of course, it is recommended to form such a thin film even when the Fe concentration is up to $1 \times 10^{17}$ atoms/$cm^3$ and the Al concentration is up to $1 \times 10^{17}$ atoms/$cm^3$. A single crystal semiconductor film where a device is to be formed, specifically a single crystal silicon film is formed on the substrate via the thin film, yielding the desired composite substrate. It is preferred that the thin film be formed so as to cover the substrate in its entirety.

Since the thin film of oxide, nitride or oxynitride is intended to prevent metal impurities in the substrate from leaching out or diffusing, the thin film must be of high purity. To this end, means for forming such films is preferably sputtering, electron beam evaporation or chemical vapor deposition. Using such means, the concentration of Al or Fe in the film can be set below the concentration in the sintered body, typically up to $1 \times 10^{17}$ atoms/$cm^3$, preferably up to $1 \times 10^{16}$ atoms/$cm^3$, and more preferably up to $1 \times 10^{15}$ atoms/$cm^3$, which is effective for suppressing contamination with metal impurities from within the substrate. The thin film preferably has a volume resistivity of $1 \times 10^8$ to $1 \times 10^{18}$ Ω·cm, and more preferably $1 \times 10^{10}$ to $1 \times 10^{16}$ Ω·cm and a heat conductivity of 2 to 100 W/m·K, and more preferably 5 to 50 W/m·K. Exemplary of the film species are insulating films of $SiO_2$, $Si_3N_4$ and $SiO_xN_y$ (wherein $0<x<2$ and $0<y<1.3$) which can be formed to a high purity by the above-mentioned means. Inter alia, silicon nitride is most preferred when it is taken into account to maintain the high heat conductivity of the substrate.

It is noted that the thin film preferably has a thickness of 0.01 to 50 μm, more preferably 0.1 to 20 μm.

Also, the single crystal semiconductor film formed on the substrate surface directly or via the thin film may be a single crystal silicon film. In most cases, the semiconductor film is preferably formed to a thickness of 0.01 to 100 μm, more preferably 0.05 to 1 μm. The methods for forming the single crystal semiconductor film include a method of bonding a substrate having hydrogen or rare gas ions implanted therein, flaking and transferring the implanted layer, like Smart-Cut method, and a method of bonding a semiconductor layer of Si or SOI and thinning by mechanical and/or chemical means.

Also, while the substrate is held by an electrostatic chuck as a general practice in the device fabrication process, it is difficult to hold silicon nitride by the electrostatic chuck because the silicon nitride itself is insulating. Therefore, the back side of the substrate must be made electroconductive or semi-conductive. This state can be established by a silicon film which allows for holding by an electrostatic chuck and eliminates the concern of contamination to the device fabrication line, while the silicon film may be embodied as a single crystal silicon film, polycrystalline silicon film or amorphous silicon film. The silicon film preferably has a thickness of 0.01 to 100 μm, more preferably 0.05 to 10 μm.

The composite substrate of the invention is mainly used in the fabrication of power devices with substantial heat generation and RF devices using high frequency.

EXAMPLES

Examples and Comparative Examples are given below for illustrating the invention, but the invention is not limited thereto.

Example 1

FIG. 1 shows one embodiment of the invention. A $Si_3N_4$ sintered body 11 having an outer diameter of 200 mm and a thickness of 725 μm was furnished as the sintered body substrate. The substrate had a volume resistivity of $1 \times 10^{14}$ Ω·cm, as measured by the four-probe method. It also had a heat conductivity of 15 W/m·K, as measured by the laser flash method. It is noted that a $Si_3N_4$ sintered body substrate having the same volume resistivity and heat conductivity as the above substrate was prepared. This substrate was dissolved in HF aqueous solution, from which a metal impurity concentration was measured by the ICP-MS method, finding a Fe concentration of $1 \times 10^{19}$ atoms/$cm^3$ and an Al concentration of $5 \cdot 10^{18}$ atoms/$cm^3$.

Over the entire surface of the substrate, a silicon nitride film 12 of 1 μm thick was formed by the LP-CVD method. The silicon nitride film thus formed was measured to have a volume resistivity of $1 \times 10^{14}$ Ω·cm and a heat conductivity of 13 W/m·K, indicating substantially equivalent physical properties to the sintered body. The metal impurity concentration in the film was determined by dissolving the film in HF aqueous solution and effecting the ICP-MS analysis. As a result, among metal impurities in the film, the richest was Fe which was present in a concentration of $1 \times 10^{15}$ atoms/$cm^3$. The next richest metal impurity was Al which was present in a concentration of $1 \times 10^{14}$ atoms/$cm^3$. Other metal impurities were present in concentrations which were below the detection limit and negligible in the device fabrication process.

A single crystal silicon thin film 13 of 0.3 μm thick was bonded to one surface of the substrate. In this way, a composite substrate with the minimized concern of metal contamination could be prepared using a cheap sintered body substrate having a high heat conductivity.

On the back surface of the substrate thus prepared, an amorphous silicon thin film 14 of 1 μm thick was deposited by the LP-CVD method. The metal impurity concentration on the amorphous silicon surface was below the detection limit as measured by the ICP-MS method, indicating no metal contamination to the back surface.

Example 2

A $Si_3N_4$ sintered body as in Example 1 was furnished as the sintered body substrate.

Over the entire surface of the substrate, a $SiO_2$ film of 1 μm thick was formed by the LP-CVD method. The $SiO_2$ film thus formed was measured to have a volume resistivity of $1\times10^{14}$ Ω·cm and a heat conductivity of 1.5 W/m·K. When the metal impurity concentration in the film was determined by the same procedure as in Example 1, both Fe and Al were present in a concentration of $1\times10^{14}$ atoms/cm$^3$. Other metal impurities were present in concentrations which were below the detection limit and negligible in the device fabrication process.

As in Example 1, a single crystal silicon thin film of 0.3 μm thick was bonded to one surface of the substrate. In this way, a composite substrate with no concern of metal contamination could be prepared using an insulating substrate having a high heat conductivity.

On the back surface of the substrate thus prepared, a polysilicon thin film of 1 μm thick was deposited by the LP-CVD method. The metal impurity concentration on the polysilicon surface was below the detection limit as measured by the ICP-MS method, indicating no metal contamination to the back surface.

Example 3

An AlN sintered body having an outer diameter of 200 mm and a thickness of 725 μm was furnished as the sintered body substrate. The substrate had a volume resistivity of $1\times10^{13}$ Ω·cm, as measured by the four-probe method. It also had a heat conductivity of 160 W/m·K, as measured by the laser flash method. A metal impurity concentration in the substrate was measured as in Example 1, finding a Fe concentration of $5\times10^{19}$ atoms/cm$^3$ and an Al concentration of $1\times10^{19}$ atoms/cm$^3$.

Over the entire surface of the substrate, as in Example 1, a silicon nitride thin film of 1 μm thick was formed by the LP-CVD method. The film thus formed had a volume resistivity, a heat conductivity and metal impurity concentrations, all equivalent to Example 1.

As in Example 1, a single crystal silicon thin film of 0.3 μm thick was bonded to one surface of the substrate. In this way, a composite substrate with no concern of metal contamination could be prepared using an insulating substrate having a high heat conductivity.

On the back surface of the substrate thus prepared, an amorphous silicon thin film of 1 μm thick was deposited by the LP-CVD method. The metal impurity concentration on the amorphous silicon surface was below the detection limit as measured by the ICP-MS method, indicating no metal contamination to the back surface.

Example 4

A SiAlON ($Si_3N_4 \cdot Al_2O_3$) sintered body having an outer diameter of 200 mm and a thickness of 725 μm was furnished as the sintered body substrate. The substrate had a volume resistivity of $1\times10^{14}$ Ω·cm, as measured by the four-probe method. It also had a heat conductivity of 45 W/m·K, as measured by the laser flash method. A metal impurity concentration in the substrate was measured as in Example 1, finding a Fe concentration of $2\times10^{19}$ atoms/cm$^3$ and an Al concentration of $1\times10^{20}$ atoms/cm$^3$.

Over the entire surface of the substrate, as in Example 1, a silicon nitride thin film of 2 μm was formed by the LP-CVD method. The film thus formed had a volume resistivity, a heat conductivity and metal impurity concentrations, all equivalent to Example 1.

As in Example 1, a single crystal silicon thin film of 0.3 μm thick was bonded to one surface of the substrate. In this way, a composite substrate with no concern of metal contamination could be prepared using an insulating substrate having a high heat conductivity.

On the back surface of the substrate thus prepared, an amorphous silicon thin film of 1 μm thick was deposited by the LP-CVD method. The metal impurity concentration on the amorphous silicon surface was below the detection limit as measured by the ICP-MS method, indicating no metal contamination to the back surface.

Comparative Example 1

A $Si_3N_4$ sintered body substrate having the same volume resistivity and heat conductivity as in Example 1 was furnished. The substrate was dissolved in HF aqueous solution, from which a metal impurity concentration was measured by the ICP-MS method, finding a Fe concentration of $1\times10^{19}$ atoms/cm$^3$ and an Al concentration of $5\times10^{18}$ atoms/cm$^3$, which were substantially higher than the concentrations in the silicon nitride film in Example 1. The substrate was not ready for use in the device fabrication process because it had metal impurity concentration levels sufficient to cause contamination of the fabrication line, despite acceptable values of volume resistivity and heat conductivity.

Comparative Example 2

An AlN sintered body substrate having the same volume resistivity and heat conductivity as in Example 3 was furnished. The substrate was dissolved in HF aqueous solution, from which a metal impurity concentration was measured by the ICP-MS method, finding a Fe concentration of $5\times10^{19}$ atoms/cm$^3$ and an Al concentration of $1\times10^{19}$ atoms/cm$^3$, which were substantially higher than the concentrations in the silicon nitride film in Example 3. The substrate was not ready for use in the device fabrication process because it had metal impurity concentration levels sufficient to cause contamination of the fabrication line, despite acceptable values of volume resistivity and heat conductivity.

Comparative Example 3

A SiAlON sintered body substrate having the same volume resistivity and heat conductivity as in Example 4 was furnished. The substrate was dissolved in HF aqueous solution, from which a metal impurity concentration was measured by the ICP-MS method, finding a Fe concentration of $2\times10^{19}$ atoms/cm$^3$ and an Al concentration of $1\times10^{20}$ atoms/cm$^3$, which were substantially higher than the concentrations in the silicon nitride film in Example 4. The substrate was not ready for use in the device fabrication process because it had metal impurity concentration levels sufficient to cause contamination of the fabrication line, despite acceptable values of volume resistivity and heat conductivity.

It was examined whether or not the wafers prepared in Examples 1 to 4 and Comparative Examples 1 to 3 could be held by an electrostatic chuck. The composite substrate was rested on a base plate which was provided with an electrode of diameter 300 mm, after which an attractive force was measured by applying a voltage of ±300 volts thereacross, pulling the substrate under the applied voltage, and measuring the force required to remove the substrate from the table by means of a load cell, the measured value being reported as the attractive force. The results are shown in Table 1.

Table 1 shows the measured values of attractive force for the composite substrates of Examples 1 to 4 and Comparative Examples 1 to 3 and a silicon wafer of the same size. As seen from the test results, the composite substrates of Comparative Examples 1 to 3 where neither amorphous silicon nor polysilicon was deposited were not held by the electrostatic chuck in a substantial sense whereas the composite substrates of Examples 1 to 4 where amorphous silicon or polysilicon was deposited showed substantially equivalent attractive forces to the silicon wafer.

TABLE 1

| Substrate type | Attractive force (N) |
| --- | --- |
| Composite substrate of Example 1 | 38.4 |
| Composite substrate of Example 2 | 37.7 |
| Composite substrate of Example 3 | 39.1 |
| Composite substrate of Example 4 | 37.6 |
| Composite substrate of Comparative Example 1 | 3.5 |
| Composite substrate of Comparative Example 2 | 1.2 |
| Composite substrate of Comparative Example 3 | 3.7 |
| Silicon wafer | 40.9 |

The invention claimed is:

1. A composite substrate consisting of an inorganic insulating sintered body substrate having a heat conductivity of at least 5 W/m·K and a volume resistivity of at least $1\times10^8$ Ω·cm, a single crystal semiconductor film, and a thin layer disposed between the inorganic insulating sintered body substrate, the single crystal semiconductor film and a layer of polycrystalline or amorphous silicon disposed on the back surface of the composite substrate, said thin layer being composed of silicon nitride deposited by a chemical vapor deposition method, and being formed to cover the inorganic insulating sintered body substrate in entirety, the single crystal semiconductor film being bonded to only the front surface of the inorganic insulating sintered body substrate via the thin layer, wherein the thin layer is a film to prevent metal impurities in the inorganic insulating sintered body substrate from leaching out or diffusing during a semiconductor device fabrication process using the composite substrate.

2. The composite substrate of claim 1 wherein the inorganic insulating sintered body is silicon nitride, aluminum nitride or SiAlON.

3. The composite substrate of claim 1 wherein the single crystal semiconductor is single crystal silicon.

4. The composite substrate of claim 1, wherein the inorganic insulating sintered body substrate has a thickness of 100 to 2,000 μm.

5. The composite substrate of claim 1, wherein the thin layer has a thickness of 0.01 to 50 μm.

6. The composite substrate of claim 1, wherein the single crystal semiconductor has a thickness of 0.01 to 100 μm.

7. The composite substrate of claim 1, wherein the single crystal semiconductor film is a flaking film from a single crystal semiconductor substrate.

8. The composite substrate of claim 1, wherein the single crystal semiconductor film is a film formed by bonding a semiconductor layer of Si or SOI and thinning by mechanical and/or chemical means.

9. The composite substrate of claim 1, wherein the single crystal semiconductor film is a film where a semiconductor device is to be formed.

10. The composite substrate of claim 1, wherein the concentration of Al in the thin layer is up to $1\times10^{17}$ atoms/cm$^3$ and the concentration of Fe in the thin layer is up to $1\times10^{17}$ atoms/cm$^3$.

* * * * *